United States Patent [19]

Kinoshita et al.

[11] Patent Number: 5,158,616
[45] Date of Patent: Oct. 27, 1992

[54] APPARATUS FOR CLEANING A SUBSTRATE

[75] Inventors: Akira Kinoshita, Tokyo; Kazuo Fushiki, Fuchu, both of Japan

[73] Assignee: Tokyo Electron Limited, Tokyo, Japan

[21] Appl. No.: 784,103

[22] Filed: Oct. 29, 1991

Related U.S. Application Data

[62] Division of Ser. No. 382,192, Jul. 20, 1989, abandoned.

[30] Foreign Application Priority Data

Jul. 22, 1988 [JP] Japan .................. 63-183062

[51] Int. Cl.⁵ .................................. B08B 3/04
[52] U.S. Cl. ..................... 134/25.4; 134/32; 134/902
[58] Field of Search ........... 134/76, 184, 200, 902, 134/77, 78, 25.4, 25.1, 32; 414/225, 226, 222

[56] References Cited

U.S. PATENT DOCUMENTS

| | | | |
|---|---|---|---|
| 473,106 | 4/1892 | Atkinson et al. | 134/77 |
| 600,182 | 3/1898 | Sparr | 134/77 |
| 3,225,675 | 12/1965 | Cross et al. | 134/76 |
| 3,406,697 | 10/1968 | Mitchell | 134/200 X |
| 3,865,298 | 2/1975 | Allen et al. | 134/902 X |
| 3,893,869 | 7/1975 | Mayer et al. | 134/902 X |
| 4,132,235 | 1/1975 | Koplin et al. | 134/200 X |
| 4,408,560 | 10/1983 | Caratsch | 134/902 X |
| 4,557,785 | 12/1985 | Ohkuma | 134/902 |
| 4,599,966 | 7/1986 | Lymn | 134/902 |
| 4,694,527 | 9/1987 | Yoshizawa | 134/200 |
| 4,715,392 | 12/1982 | Abe et al. | |

FOREIGN PATENT DOCUMENTS

| | | |
|---|---|---|
| 47-45255 | 11/1972 | Japan . |
| 52-95166 | 8/1977 | Japan . |
| 64-9618 | 2/1989 | Japan . |
| 64-9619 | 2/1989 | Japan . |
| 64-9620 | 2/1989 | Japan . |

Primary Examiner—Frankie L. Stinson
Attorney, Agent, or Firm—Oblon, Spivak, McClelland, Maier & Neustadt

[57] ABSTRACT

A cleaning apparatus is disclosed which is used in a manufacturing process of a semiconductor device. A plurality of treatment chambers are vertically mounted in a parallel array along a path of carriage of a substrate to be treated. One sheet of substrate is held within one of the treatment chambers at a time. The width of the treatment chamber is so small as to properly contain the substrate in a direction of the thickness of the substrate and hence the whole length of the cleaning apparatus can be made smaller. The substrate is held by a universally-jointed arm which is mounted on a carrier, and inserted/withdrawn into/out of the treatment chamber by that arm. The treatment chamber is of the type wherein a substrate is immersed into a cleaning solution, a support base is mounted therein to maintain the substrate vertically, and an ultrasound oscillation source is provided therein.

15 Claims, 1 Drawing Sheet

APPARATUS FOR CLEANING A SUBSTRATE

This application is a division of application Ser. No. 07/382,192, filed on Jul. 20, 1989, now abandoned.

BACKGROUND OF THE INVENTION

1. Field of the Invention

The present invention relates to a substrate cleaning apparatus used in the manufacturing of a semiconductor device, and, more particularly, to an apparatus for cleaning substrates (wafers) arranged vertically.

2. Description of the Related Art

In the manufacturing of semiconductor devices, for example, each semiconductor wafer is washed repeatedly in the course of the various manufacturing steps, since the wafer surface, if contaminated, will adversely affect the characteristics of the finished semiconductor devices. Hence, thorough cleaning of the wafers is an important part of the manufacturing of semiconductor devices.

As an apparatus for cleaning a to-be-treated semiconductor wafer substrate, a batch type cleaning apparatus has been so far employed, which is adapted to wash a plurality of substrates at a time. This type of apparatus is disclosed in Japanese Patent Disclosure (KOKAI) 52-95166. In order to obtain a high yield in the manufacturing process of semiconductor devices of high integration density, such as 4M and 16M devices, and microminiaturized circuit patterns, increasingly strict demands have been made in regard to the thoroughness of the cleaning process. However, the aforementioned batch type substrate cleaning apparatus cannot meet the currently required standards, for a variety of reasons, the such principal reason being its inability to wash every substrate to the same degree of thoroughness.

Recently, a sheet-by-sheet type cleaning apparatus has been developed which is designed to wash to-be-treated substrates one sheet at a time. This type of cleaning apparatus includes a plurality of narrow-profile treatment chambers which are arranged sequentially in a parallel array along a path on which a carrier is run to transfer the substrate to the treatment chamber. Specifically, the substrate is held by a suction arm of the carrier and is transferred by that arm from one treatment chamber to another. The substrate is inserted horizontally into the respective treatment chamber and washed while in this state.

Since, in this case, the length of the apparatus corresponds at least to the length of one treatment chamber x the number of chambers, the apparatus becomes undesirably bulky. If the apparatus is designed to wash, for example, an 8-inch substrate, then the length of one treatment chamber would be ten and a few inches. Assuming that there are three chambers of this size, in addition to a cassette loader and an unloader, then the length of the cleaning apparatus would come to at least 5 feet. Generally, the cleaning apparatus is installed within a clean room whose construction and maintenance costs are high. It is therefore desirable that the amount of space taken up by the cleaning apparatus be as small as possible.

In this type of cleaning apparatus, the substrate is washed often, with an ultrasound oscillation being simultaneously applied thereto. In this case, however, an oscillation source is provided only on the rear side of the substrate, failing to effectively wash away a contaminant which is physically deposited on the major surface of the substrate.

Furthermore, when the substrate is immersed in the cleaning solution, a buoyant force is exerted on the substrate in a cross sectional direction and due care has to be exercised in the design of the cleaning apparatus not to apply any excessive load to that thin substrate upon the immersion of the substrate into the cleaning solution.

SUMMARY OF THE INVENTION

An object of the present invention is to provide a cleaning apparatus which can reduce its occupation space by arranging an array of treatment chambers more compact than that required in a conventional cleaning apparatus.

Another object of the present invention is to provide a cleaning apparatus which can enhance the cleaning function by substantially enhancing the effect of an ultrasound oscillation upon a substrate.

Another object of the present invention is to provide a cleaning apparatus which can eliminate any adverse effect upon a substrate by a buoyant force in a cross-sectional direction upon the immersion of the substrate into the cleaning solution.

According to the present invention, there is provided a cleaning apparatus for cleaning a semiconductor wafer substrate to be treated, comprising:

means for carrying the substrate between a load position and an unload position of the substrate;

at least one cleaning chamber located along a path of carriage of the substrate by the carrying means, the cleaning chamber vertically holding and treating the substrate in place; and means, provided on the carrying means, for holding the substrate and for inserting and withdrawing the substrate into and out of the cleaning chamber.

Since, in the aforementioned apparatus, the width of the treatment chamber, a factor determining a whole length of the cleaning apparatus, is determined by the thickness of the substrate, that width is very much small compared with the depth and side length of the treatment chamber which depends upon the diameter of the substrate. As a result, the whole length of the cleaning apparatus becomes small irrespective of the dimension of the substrate to be treated, thus satisfying an occupation space requirement.

Preferably, a support base is located within the treatment chamber to which the substrate gains access in a vertical direction, and sheets of such substrate are treated in the chamber one at a time. Furthermore, the substrate may be vertically supported in the treatment chamber with an ultrasound oscillation source provided at least on a major surface side of the substrate.

Since the ultrasound oscillation source is provided at least on the major surface side of the substrate which is vertically held in place, a contaminating source which is physically deposited on the major surface of the substrate is liable to be eliminated from that major surface due to an action of an ultrasound oscillation upon the surface. Furthermore, since the substrate is inserted vertically into the treatment chamber and immersed into the cleaning solution of the treatment chamber, it is possible to eliminate an adverse effect upon the substrate by a buoyant force in a direction of the cross-section of the substrate.

DETAILED DESCRIPTION OF THE PREFERRED EMBODIMENT

Figure 1:
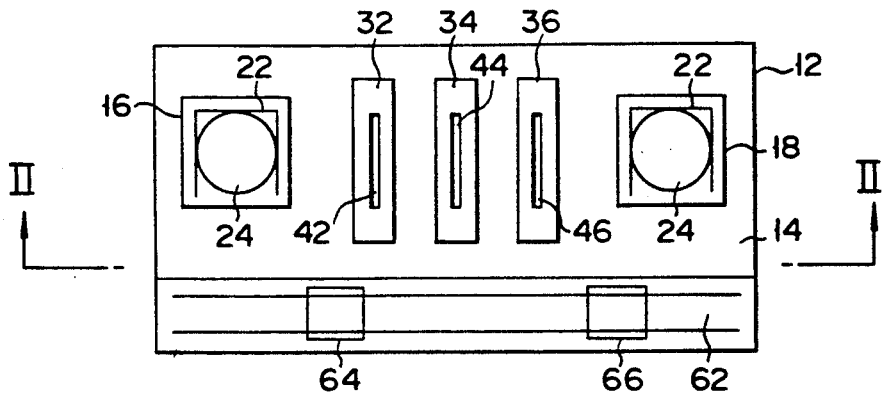
FIG. 1 is a plan view, in longitudinal cross-section, showing a cleaning apparatus according to a desirable embodiment of the present invention, a view being taken along line 1—1 in FIG. 2.
Figure 2:
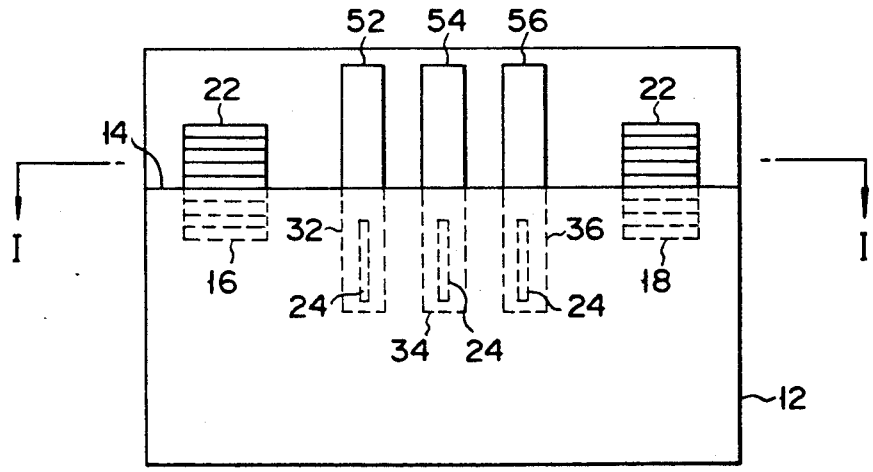
FIG. 2 is a front view, taken along line 2—2 in FIG. 1, showing the cleaning apparatus.

A loader 16 is located at one end portion of a casing 12 of a cleaning apparatus according to the present invention with a multi-tray type substrate cassette 22 placed thereon. The loader 16 can be lifted by a driving mechanism, not shown, which is held within the casing 12. The loader 16 moves the substrate cassette 22 up and down relative to a surface of a table 14 of the casing so that a predetermined tray of the cassette 22 is sequentially set to a position (a load position) where a carrier arm 68 as will be set forth below can withdraw a substrate 24 which is to be washed from the cassette. An unloader 18 is located at the other end portion of the casing 12 with a multi-tray substrate cassette 22 placed thereon and adapted to be moved up and down by a driving mechanism, not shown, which is disposed within the casing 12 The unloader 18 moves the substrate cassette 22 up and down relative to the surface of the table 14 of the casing so that a predetermined tray is sequentially set to a position (an unload position) where a carrier arm 68 as will be set forth below can insert the substrate 24 which has been washed onto the cassette.

Figure 3:
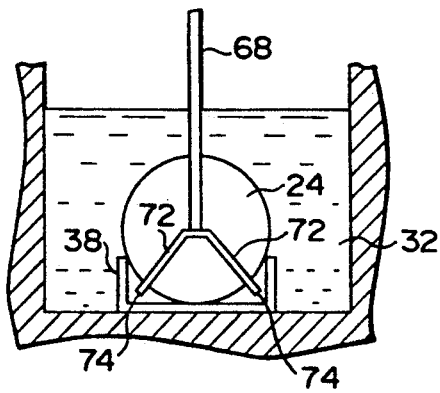
FIG. 3 is a cross-sectional view showing a state in which a substrate to be treated is immersed into a cleaning solution which is held within a chemicals wash chamber.
Figure 4:
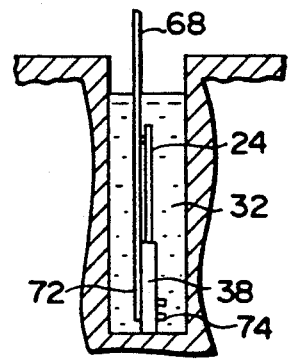
FIG. 4 is a front view showing a state similar to that in FIG. 3.

Between the loader 16 and the unloader 18, three treating chambers, that is, a chemicals wash chamber 32, water wash chamber 34 and drying chamber 36 are located in this order as viewed from the loader side toward the unloader side. The respective treating chambers 32, 34 and 36 extend vertically downward from the table 14 of the casing to hold the substrate 24 in a vertical state. A holding or support base 38 (see FIGS. 3 and 4) is located within the respective treating chamber to allow the substrate 24 to be held in a vertical state. A pipe arrangement is connected to the treating chamber 32, 34 and 36 to allow the substrate to be subjected to a chemicals wash water wash and dry step.

Although the dimensions of the respective treating chambers 32, 34 and 36, for example, the depth and side length of the chambers 32, 34 and 36 may largely be changed, the width of the chambers 32, 34 and 36, a factor determining a whole length of the apparatus, is of the order of several inches. If, for example, the cleaning apparatus shown can wash a 8-inch substrate 24, then the whole length of the apparatus is about three feet, that is, one half to two-thirds that of a conventional apparatus whose treating chambers 32, 34 and 36 are arranged in a horizontal array. It is thus possible to reduce an occupation space, which is demanded in this type of cleaning apparatus.

Slit-like openings 42, 44 and 46 are formed in the table 14 so as to correspond to the treating chambers 32, 34 and 36, respectively. The side length of the slit-like openings 42, 44 and 46 will largely be varied in accordance with the dimension of the substrate to be treated. Covers 52, 54 and 56 are arranged to cover the top areas of the respective slit-like openings 42, 44 and 46 and swingably supported on the table 14 at their "side length" direction (an upper side in FIG. 1). When the substrate 24 is inserted into, or withdrawn from, the chamber via the slit-like opening (42, 44, 46), the respective cover (52, 54, 56) is automatically swung open and, upon the cleaning of the substrate, closed so that a treating space is closed.

A track rail 62 is provided on a table 14 at a location adjacent to the loader 16, treating chambers (32, 34, 36) and unloader 18. First and second carriers 64 and 66 are movably disposed on the track rail 62 to allow the substrate to be carried. An arm mechanism 68 (see FIGS. 3 and 4) of a known structure is attached to the respective carrier to hold the substrate. A pair of fingers 72 extend from the forward end of the arm 68 to support the rear surface side of the substrate 24. A hook 74 is mounted on the forward end of the finger to engage with the outer periphery of the substrate 24. In the embodiment shown, the substrate is firmly held from a horizontal state to a vertical state in cooperation with the fingers 72 and hooks 74. A universal joint section, not shown, is provided on the arm 68 so as to allow a predetermined swinging motion to be made with the substrate held by the fingers 72. The technique of the universal joint section is already known in the art.

The operation of the cleaning apparatus is controlled by a computer. The opening/closing of the covers 52, 54 and 56, the predetermined operation of the carriers 64, 66 and arm 68 and the cleaning or drying of the substrate in the treating chamber are automatically achieved in accordance with an initially incorporated program.

The aforementioned cleaning apparatus is used in the following way.

First, the substrate cassette 22, with a plurality of substrates to be treated held therein, is located on the loader 16 which is placed at the lowest position, while another cassette 22 with no substrates is located on the unloader 18 which is placed at the lowest position. The loader 16 allows the substrate cassette 22 to be sequentially lifted stepwise and hence the topmost tray of the cassette is first set to a load position on the table 14. The first carrier 64 to the left in FIG. 1 is moved on the track rail 62 to a position adjacent to the loader 16. The arm 68 of the first carrier 64 is inserted into the corresponding tray of the cassette 22. The arm 68 is brought into engagement with the edge of the substrate 24 by the hook 74 on the forward end of the finger 72 to withdraw the substrate from that tray in the horizontal direction.

Then the first carrier 64 is moved on the track rail 62 up to a position adjacent to the chemicals wash chamber 32 and then the arm 68 is swung by its own universal joint section to allow the held substrate to be moved from a horizontal state to a vertical state. In parallel with this movement, the cover 52 of the chemicals wash chamber 32 is opened and the substrate 24 is loaded via the corresponding slit-like opening 42 into the chemicals wash chamber 32 with that substrate held by the fingers 72 of the arm. The substrate 24 is vertically immersed in a chemicals solution of the chemicals wash chamber 32 and rests on the support base 38 (see FIG. 3). The substrate 24 is vertically inserted into that solution at the time of immersion, thus eliminating an adverse effect which is exerted by a buoyant force over the substrate in a direction of the cross-section of the substrate. Upon the resting of the substrate 24 on the support base 38 within the chemicals wash chamber 32, the hook 74 of the forward end of the fingers is disengaged from the edge of the substrate 24, leaving the substrate 24 within the chemicals solution. At this time, the arm 68 is withdrawn out of the chemicals wash chamber 32.

Then the cover 52 is closed and the substrate is subjected to a predetermined chemicals wash step. As the cleaning solution, for example, a blend solution of hydrogen peroxide with sulfuric acid or hydrochloric acid, hydrofluoric acid, and so on are selected for acid cleaning and a blend solution of ammonia and hydrogen peroxide, and so on are selected for alkali cleaning. The cleaning step is carried out by immersing the substrate 24 in the cleaning solution for a predetermined period of time, for example, a few minutes and at the same time an ultrasound oscillation is applied, by a mechanism not shown, to either both surface sides or only a major surface side of the substrate 24. As an oscillation source is provided at least on the major surface side of the substrate 24 and the substrate is held in a vertical state, a contaminating source physically attached to the major surface of the substrate is liable to be removed from that surface, enhancing the cleaning function of the cleaning apparatus. In the cleaning step, the temperature of the cleaning solution is controlled to be, for example, at 80° C. to 130° C. It is preferable, in order to enhance the cleaning action, that the cleaning solution be agitated.

After the treatment of the substrate within the chemicals wash chamber 32 has been completed, the cover 52 is opened and the treated substrate 24 is taken by the arm 68 of the first carrier 64 out of the chemicals wash chamber 32. The substrate 24 is carried to the position of the water wash chamber 34 and, in the same way as set forth above in connection with the chemicals wash chamber 32, loaded into the water wash chamber 34 via the corresponding opening 44. The cover 54 of the water wash chamber 34 is opened, in the timing in which the substrate 24 is carried, and closed after the arm 68 of the carrier has been withdrawn with the substrate left within the water wash chamber 34. The substrate 24 is vertically held by the support base 38 within the water wash chamber 34 and subjected to a water wash step.

The clearing of the substrate 24 is performed by immersing it in a rinse water at a suitable temperature, such as 80° C. to 130° C., for a predetermined period of time, for example, a few minutes and an ultrasound oscillation is applied, by a mechanism not shown, to either both the surface sides or only one surface side of the substrate 24.

After the cleaning of the substrate within the water wash chamber 34 has been carried out, the cover 54 is opened and the substrate 24 is taken out of the water wash chamber 34 by the arm 68 of the second carrier 66 which is shown to the right in FIG. 1. The substrate 24 thus taken out is carried by the second carrier 66 to the next drying chamber 36 and, in the same way a set forth above in conjunction with the chemicals wash chamber 32, inserted into the drying chamber 36 via the opening 46. The cover 56 of the drying chamber is opened, in the timing in which the substrate 24 is carried, and closed after the arm 68 of the carrier has been withdrawn out of the drying chamber 36 with the substrate left within the drying chamber 36. The substrate 24 is vertically held on the support base 38 within the drying chamber 36 and subjected to drying step. The drying step is carried out by the supplying of an air flow at a suitable temperature, such as 80° C. to 130° C., for a predetermined period of time, for example, a few minutes.

After the treatment of the substrate has been completed within the drying chamber 36, it is taken by the arm 68 of the second carrier 66 out of the drying chamber 36. The substrate 25 thus taken out is carried by the second carrier 66 to the unloader 18 on the right-hand side where the arm 68 is swung by a joint section to allow the substrate 24 to be swung from a vertical state to a horizontal state. The unloader 18 allows the substrate cassette 22 to be sequentially lifted stepwise so as to set each tray of the substrate cassette, from the top tray, at a corresponding unload position above the surface of the table. With the substrate 24 held horizontally by the arm 68 of the second carrier, the substrate 24 is inserted into the tray of the substrate cassette 22 which is set to the unload position.

On the other hand, after the substrate 24 as set forth above has been transferred from the chemicals wash chamber 32 to the water wash chamber 34 by the first carrier 64 as shown to the left in FIG. 1, the first carrier 64 is returned back to the initial position adjacent to the loader 16 and the next substrate 24 is withdrawn out of the corresponding tray of the cassette. Then, the next substrate 24 is carried to the location cf the chemicals wash chamber 32 where the chemicals cleaning is carried out. After the preceding substrate 24 has been transferred from the water wash chamber 34 to the drying chamber 36 by the second carrier 66 as shown to the right in FIG. 1, said next substrate 24 is transferred from the chemicals wash chamber 32 immediately to the water wash chamber 34 by the first carrier 64 as shown to the left in FIG. 1 and the cleaning of the substrate is carried out. In this way, the respective operation steps are conducted relative to a plurality of the substrates 24 in a parallel way. That is, the plurality of substrates are sequentially subjected to a load, a chemicals wash, water wash and an unload step in a parallel fashion and hence these substrates are transferred from the substrate cassette 22 as shown on the left side in FIG. 1 to the substrate cassette 22 as shown to the right side in FIG. 1.

Although the present invention has been explained in conjunction with a desired embodiment shown in the accompanying drawing, various changes and modifications will become apparent without departing from the spirit and scope of the prevent invention. For example, the treating chamber can be changed to receive and treat a plurality of the substrates at a time, in which case, the depth of the chamber may be increased and a plurality of the substrates arranged vertically side by side. If, the treated substrate is returned back to the original corresponding cassette tray, then the unloader is unnecessary and, in this case, the load position and unload position are generally or substantially the same. An optional treatment may be made within the treating chamber. It may be possible to perform a chemicals wash and water wash step in a common treating chamber. It is also possible to optionally select the number of treatment chambers.

What is claimed is:

1. A method of cleaning a plate-like substrate by using a cleaning apparatus comprising a carriage path for carrying the substrate and having a first end adjacent to a substrate load section and a second end adjacent to a substrate unload section; a plurality of cleaning chambers comprising a chemical wash chamber, a water wash chamber, and a drying chamber located along the carriage path in the above order, each chamber treating one substrate at a time and having an opening through which the substrate is inserted and withdrawn; a support base located within each chamber to maintain the substrate placed in the chamber; first and second carrying members movable along the carriage path for carrying the substrate along the carriage path; and first and second arms for handling the substrate, said first and second arms being provided on the first and second carrying members, respectively; the method comprising the steps of:

positioning the first carrying member at the first end;

picking up the substrate from the load section by using the first arm;

moving the first carrying member with the substrate thereon along the carriage path to a position adjacent to the chemical wash chamber;

inserting the substrate into the chemical wash chamber through the opening thereof by using the first arm such that the main surface of the substrate is substantially vertical and perpendicular to the carriage path;

mounting the substrate on the support base of the chemical wash chamber by using the first arm such that the main surface of the substrate is substantially vertical and perpendicular to the carriage path;

withdrawing the first arm from the chemical wash chamber and leaving the substrate on the support base;

washing the substrate in the chemical wash chamber;

withdrawing the substrate from the chemical wash chamber by using the first arm;

moving the first carrying member with the substrate thereon along the carriage path to a position adjacent to the water wash chamber;

inserting the substrate into the water wash chamber through the opening thereof by using the first arm such that the main surface of the substrate is substantially vertical and perpendicular to the carriage path;

mounting the substrate on the support base of the water wash chamber by using the first arm such that the main surface of the substrate is substantially vertical and perpendicular to the carriage path;

withdrawing the first arm from the water wash chamber and leaving the substrate on the support base;

washing the substrate in the water wash chamber;

positioning the second carrying member at a position adjacent to the water wash chamber;

withdrawing the substrate from the water wash chamber by using the second arm;

moving the second carrying member with the substrate thereon along the carriage path to a position adjacent to the drying chamber;

inserting the substrate into the drying chamber through the opening thereof by using the second arm;

mounting the substrate on the support base of the drying chamber by using the second arm;

withdrawing the second arm from the drying chamber and leaving the substrate on the support base;

drying the substrate in the drying chamber;

withdrawing the substrate from the drying chamber by using the second arm;

moving the second carrying member with the substrate thereon along the carriage path to the second end; and passing the substrate to the unload section by using the second arm;

wherein after the washing of a first substrate in the chemical wash chamber and during the processing of a first substrate, the processing of a second substrate is started while the first carrying member and arm, and the second carrying member and arm are operated respectively and at the same time.

2. A method according to claim 1, wherein the substrate is immersed in a cleaning liquid in each of the chemical and water wash chambers.

3. A method according to claim 2, wherein the substrate is vertically inserted into the cleaning liquid.

4. A method according to claim 2, wherein ultrasound oscillation is emitted onto the substrate in each of the chemical and water wash chambers.

5. A method according to claim 1, wherein each of the openings is opened and closed by a cover.

6. A method according to claim 5, wherein the opening and closing of each of the covers is controlled in association with the operations of the arms.

7. The method according to claim 1, wherein the substrate is inserted into the drying chamber through the opening thereof such that the main surface of the substrate is substantially vertical perpendicular to the carriage path, and wherein the substrate is mounted on the support base of the water wash chamber such that the main surface of the substrate is substantially vertical and perpendicular to the carriage path.

8. The method according to claim 1, wherein the second substrate is moved to the water wash chamber from the chemical wash chamber while the first substrate is being moved to the drying chamber from the water wash chamber.

9. A method of cleaning a plate-like substrate by using a cleaning apparatus comprising a carriage path for carrying the substrate and having a first end adjacent to a substrate load section and a second end adjacent to a substrate unload section; a plurality of cleaning chambers comprising a wash chamber and a drying chamber located along the carriage path in the above order, each chamber treating one substrate at a time, and having an opening through which the substrate is inserted and withdrawn; a support base located within each chamber to maintain the substrate placed in the chamber; first and second carrying members movable along the carriage path for carrying the substrate along the carriage path; and first and second arms for handling the substrate, said first and second arms being provided on the first and second carrying members, respectively; the method comprising the steps of:

positioning the first carrying member at the first end;

picking up the substrate from the load section by using the first arm;

moving the first carrying member with the substrate thereon along the carriage path to a position adjacent to the wash chamber;

inserting the substrate into the wash chamber through the opening thereof by using the first arm such that the main surface of the substrate is substantially vertical and perpendicular to the carriage path;

mounting the substrate on the support base of the wash chamber by using the first arm such that the main surface of the substrate is substantially vertical and perpendicular to the carriage path;

withdrawing the first arm from the wash chamber and leaving the substrate on the support base;

washing the substrate in the wash chamber;

withdrawing the substrate from the wash chamber;

transferring the substrate along the carriage path to a position adjacent to the drying chamber;

inserting the substrate into the drying chamber through the opening thereof;

mounting the substrate on the support base of the drying chamber;

drying the substrate in the drying chamber;

positioning the second carrying member at a position adjacent to the drying chamber;

withdrawing the substrate from the drying chamber by using the second arm;

moving the second carrying member with the substrate thereon along the carriage path to the second end; and passing the substrate to the unload section by using the second arm;

wherein after the washing of a first substrate in the wash chamber and during the processing of the first substrate, the processing of a second substrate is started while the first carrying member and arm, and the second carrying member and arm are operated respectively and at the same time.

10. The method according to claim 9, wherein the substrate is inserted into the drying chamber through the opening thereof such that the main surface of the substrate is substantially vertical and perpendicular to the carriage path, and wherein the substrate is mounted on the support base of the water wash chamber such that the main surface of the substrate is substantially vertical and perpendicular to the carriage path.

11. A method according to claim 9, wherein the substrate is immersed in a cleaning liquid in the wash chamber.

12. A method according to claim 11, wherein the substrate is inserted vertically into the cleaning liquid.

13. A method according to claim 11, wherein ultrasound oscillation is emitted onto the substrate in the wash chamber.

14. A method according to claim 9, wherein each of the openings is opened and closed by a cover.

15. A method according to claim 14, wherein the opening and closing of each of the covers is controlled in association with the operations of the arms.

* * * * *